United States Patent
Watanabe et al.

(10) Patent No.: US 7,558,306 B2
(45) Date of Patent: Jul. 7, 2009

(54) SEMICONDUCTOR LASER DEVICE

(75) Inventors: Masanori Watanabe, Nara (JP);
Shinichi Kawato, Kashiwara (JP);
Mitsuhiro Matsumoto, Kashihara (JP)

(73) Assignee: Sharp Kabushiki Kaisha, Osaka (JP)

( * ) Notice: Subject to any disclaimer, the term of this patent is extended or adjusted under 35 U.S.C. 154(b) by 154 days.

(21) Appl. No.: 11/134,519

(22) Filed: May 23, 2005

(65) Prior Publication Data
US 2006/0007976 A1    Jan. 12, 2006

(30) Foreign Application Priority Data
May 24, 2004    (JP)    ............ P2004-153200

(51) Int. Cl.
*H01S 5/00*    (2006.01)
(52) U.S. Cl. .............. 372/45.01; 372/45.013; 372/46.01
(58) Field of Classification Search .............. 372/45–46
See application file for complete search history.

(56) References Cited

U.S. PATENT DOCUMENTS

| | | | | |
|---|---|---|---|---|
| 5,528,617 | A * | 6/1996 | Kobayashi et al. | 372/46.01 |
| 6,002,701 | A * | 12/1999 | Kan et al. | 372/46.01 |
| 6,037,189 | A * | 3/2000 | Goto | 438/31 |
| 6,195,375 | B1 * | 2/2001 | Hirata | 372/46.01 |
| 6,312,780 | B1 * | 11/2001 | Kasami et al. | 428/64.1 |
| 6,400,742 | B1 * | 6/2002 | Hatakoshi et al. | 372/46.01 |
| 6,414,976 | B1 * | 7/2002 | Hirata | 372/45.013 |
| 6,711,197 | B2 | 3/2004 | Tojo et al. | |
| 2002/0141469 | A1 * | 10/2002 | Yamasaki et al. | 372/46 |
| 2004/0066818 | A1 * | 4/2004 | Yamamoto et al. | 372/45 |
| 2004/0101011 | A1 * | 5/2004 | Kan | 372/45 |
| 2004/0114651 | A1 * | 6/2004 | Tanaka et al. | 372/46 |

FOREIGN PATENT DOCUMENTS

| | | |
|---|---|---|
| CN | 1380726 | 11/2002 |
| JP | 2001-015864 | 1/2001 |
| JP | 2001-160653 | 6/2001 |
| JP | 2002-237661 | 8/2002 |
| JP | 2002-359436 | 12/2002 |
| JP | 2003-031909 | 1/2003 |

* cited by examiner

*Primary Examiner*—Minsun Harvey
*Assistant Examiner*—Yuanda Zhang
(74) *Attorney, Agent, or Firm*—Morrison & Foerster LLP

(57) ABSTRACT

In a semiconductor laser device of the invention, a ridge portion 150 forms a waveguide, and guided light goes along the ridge portion 150. A tail of the guided layer is present also at first side portions 151, while second side portions 152 are regions which the tail of the guided light does not reach. Meanwhile, scattered light generated from the ridge portion 150 goes through the first side portions 15, spreading into the second side portions 152. In the second side portions 152, a light absorption layer 127 serving as a light absorber is formed on the first upper clad layer 108, where the scattered light is absorbed. As a result of the absorption of scattered light in the second side portions 152, ripples of radiation light are reduced. Also since the light absorption layer 127 is in electrical contact with a p-side ohmic electrode 125, the problem of charge accumulation to the light absorption layer 127 can be avoided.

15 Claims, 12 Drawing Sheets

SEMICONDUCTOR LASER DEVICE

CROSS-REFERENCE TO RELATED APPLICATIONS

This nonprovisional application claims priority based on Application No. 2004-153200 filed on May 24, 2004 in Japan under 35 U.S.C. sctn.119(a), the entirety of which is incorporated herein by this reference.

BACKGROUND OF THE INVENTION

The present invention relates to semiconductor laser devices, for example, to an optical-disk use semiconductor laser device suitable for data write to optical disks and data read from optical disks.

Conventionally, semiconductor laser devices of the end face emission type have been used as optical-disk use semiconductor laser devices. Optical-disk use semiconductor laser devices necessitate laser light that allows a good spot shape on the optical disk to be obtained, i.e., laser light that allows a good far field pattern to be obtained.

In some cases, there may occur defectives in the far field pattern, particularly ripples in the radiation light, unsuitable as optical disk use. The ripples could be attributed to the cause that guided light is partly scattered from a waveguide so that the guided light and the scattered light are superimposed on each other. Such a phenomenon more likely appears especially when the waveguide width WO is narrowed in order that kinks will not occur even if the semiconductor laser device is enhanced in output power.

This mechanism is explained with reference to FIG. 14, which is a schematic explanatory view as a waveguide 501 is viewed from above. Guided light 503 and scattered light 505, emitted with a distance Ls therebetween, phase difference between an electric field g (θ) of the guided light 503 and an electric field s (θ) of the scattered light varies in a period of 2π(Ls·sin θ)/λ. As a result of this, an angle θ at which phases strengthen each other and an angle θ at which phases weaken each other appear periodically. As an example, fine ripples are superimposed on horizontal radiation light as shown by a characteristic C1 depicted in solid line in FIG. 4. It is noted that a characteristic C2 shown by broken line in FIG. 4 indicates a horizontal radiation distribution without ripples.

SUMMARY OF THE INVENTION

Accordingly, an object of the present invention is to provide a semiconductor laser device capable of suppressing disturbance of the distribution configuration of radiation light intensity.

In order to achieve the above object, there is provided a semiconductor laser device comprising:

a ridge portion in which a lower clad layer, an active layer, a first upper clad layer, a second upper clad layer, and an electrode layer are stacked in order;

first side portions which are placed on both outer sides of the ridge portion and in which the lower clad layer, the active layer, the first upper clad layer, and a buried layer having a refractive index smaller than that of the first upper clad layer are stacked in order; and second side portions which are placed on both outer sides of the first side portions and in which the lower clad layer, the active layer, the first upper clad layer, and a light absorption layer are stacked in order, wherein the light absorption layer is in electrical contact with the electrode layer.

In this semiconductor laser device, the ridge portion forms a waveguide, and guided light goes along the ridge portion. A tail of the guided light is present also at the first side portions. Meanwhile, the second side portions are regions which the tail of the guided light does not reach.

Scattered light generated from the ridge portion goes through the first side portions, spreading into the second side portions. In the second side portions, a light absorption layer serving as a light absorber is formed on the first upper clad layer, where the scattered light is absorbed. As a result of the absorption of scattered light in the second side portions, ripples of radiation light are reduced.

It is noted that such materials as metals or semiconductors other than insulators have a property that the term k related to light absorption out of the complex refractive index (n+ik) is larger than that of insulators or the like, thus suitable as the material of the light absorber for absorption of scattered light.

As an example, when the light absorption layer is out of contact with the electrode layer forming part of the ridge portion, the light absorption layer comes in a so-called electrically floating state, causing a possibility that unnecessary electrical charge is accumulated in the light absorption layer. This charge accumulation to the light absorption layer may cause an instability of operation and, in extreme cases, leads to dielectric breakdown due to discharge. Thus, it is desirable that the potential of the conductive material forming the light absorption layer to be fixed.

According to the present invention, since the light absorption layer is in electrical contact with the electrode layer, the charge accumulation to the light absorption layer is prevented.

In one embodiment of the present invention, the second side portions have an insulating layer between the first upper clad layer and the light absorption layer.

In the semiconductor laser device of this embodiment, since the second side portions have an insulating film provided between the first upper clad layer and the light absorption layer, flow of an ineffective current through the light absorption layer can reliably be prevented even in the case where the light absorption layer is prevented from coming into the floating state.

In one embodiment of the present invention, a distance between an upper end of the active layer and a lower end of the buried layer in the first side portions is longer than a distance between an upper end of the active layer and a lower end of the light absorption layer in the second side portions.

In the semiconductor laser device of this embodiment, the thickness of the first upper clad layer in the first side portions is smaller than the thickness of the first upper clad layer in the second side portions. That is, the light absorption layer of the second side portions is closer to the active layer than the buried layer of the first side portions, so that ripples of radiation light can be further suppressed. The reason of this is that scattered light becomes increasingly higher in light intensity as the light absorption layer becomes closer to the active layer that has a high refractive index.

In one embodiment of the present invention, the light absorption layer is made from at least one of Ru, Os, Zr, Mo, W, Re, Zn, Fe, Sn, Ti, Cr, Sb, Ir, Mn, Pt and Pd.

In the semiconductor laser device of this embodiment, the light absorption layer is a metal layer, e.g. alloy film or multilayer film, which is made from at least one of Ru(4.96+4.78i), Os(3.81+1.75i), Zr(3.80+6.05i), Mo(3.74+3.58i), W(3.70+2.94i), Re(3.54+2.50i), Zn(3.45+4.19i), Fe(3.31+3.75i), Sn(3.15+7.28i), Ti(3.03+3.65i), Cr(2.97+4.85i), Sb(2.8+4.5i), Ir(2.57+4.68i), Mn(2.56+3.65i), Pt(2.38+4.26i) and Pd(2.3+2.7i). It is noted that the parenthesized description added to the symbols of elements is based on literature data of complex refractive indexes at wavelengths that are as close to a wavelength of 0.65 μm as possible.

These metals exhibit a light absorption effect in emission wavelengths of semiconductor lasers, particularly in visible light such as red, and have less adverse effects even when formed on semiconductor. The more the refractive index n is greater and the absorption coefficient k is higher, the more the light absorption effect becomes greater. The material of the light absorption layer should be selected in consideration of easiness of formation, stability, resource quantity of material in addition to the light absorption effect.

In one embodiment of the present invention, the light absorption layer is made from any one of Ge, Si, $Si_xGe_{1-x}$ ($0 \leq x \leq 1$), GaAs, InGaAs, AlGaAs, InP, $(Al_xGa_{1-x})_yIn_{1-y}P$ ($0 \leq x \leq 1$, $0 \leq y \leq 0.5$) and InGaAs.

In the semiconductor laser device of this embodiment, the light absorption layer is made from any one of Ge(4.66+1.65i), Si(4.23+0.57i), $Si_xGe_{1-x}$ (where $0 \leq x \leq 1$), GaAs (3.817+0.173i), InGaAs, AlGaAs, InP, $(Al_xGa_{1-x})_yIn_{1-y}P$ (where $0 \leq x \leq 1$, $0 \leq y \leq 0.5$) and InGaAsP.

It is noted that the parenthesized complex numbers are literature data of complex refractive indexes at wavelengths that are as close to a wavelength of 0.65 μm as possible. These materials, although being electrically semiconductors, yet behave as absorbers to light, as metals do, because their band gap energy is smaller than the energy (wavelength) corresponding to the emission wavelength of the laser from the optical point of view. Also, generally, these semiconductors are smaller in conductivity and capable of being controlled in conductive type as compared with metals, thus making it easier to suppress the ineffective current. Further, these semiconductors have less adverse effects even when formed on a semiconductor laser structure.

In one embodiment of the present invention, a width of each of the first side portions is 1 μm to 5 μm.

In the semiconductor laser device of this embodiment, the width of each of the first side portions is 1 μm to 5 μm. If the width of the first side portions is not more than 5 μm, the ripples of radiation light can be suppressed to 80% or less. If the width of the first side portions is not less than 1 μm, the increase in absorption loss of guided light can be suppressed to 1 $cm^{-1}$.

In one embodiment of the present invention, the first side portions have a width of 1 μm to 5 μm in its portions except for vicinities of a light-emission end face, and a width at the light-emission end face is smaller than the width in the portions except for the vicinities of the light-emission end face.

In the semiconductor laser device of this embodiment, the width of the first side portions is narrowed in the vicinities of the light-emission end face. As a result of this, the second side portions placed on both outer sides of the first side portions become closer to the ridge portion forming the waveguide in the vicinities of the light-emission end face more than regions except for the vicinities of the light-emission end face. Accordingly, scattered light that could cause ripples of radiation light can effectively be absorbed by the light absorption layer of the second side portions in the vicinities of the light-emission end face, while increase in the waveguide loss due to the light absorption layer of the second side portions is suppressed in portions except for the vicinities of the light-emission end face.

In one embodiment of the present invention, the first side portions have a width of substantially zero at a light-emission end face.

In the semiconductor laser device of this embodiment, with the window part formed in a proximity to the light-emission end face, scattered light that could cause ripples of radiation light can effectively be absorbed, while the waveguide loss in this window part is suppressed to about 0.1 $cm^{-1}$.

In one embodiment of the present invention, a thickness of the light absorption layer is 5 nm or more.

In the semiconductor laser device of this embodiment, since the thickness of the light absorption layer is 5 nm or more, a light absorption effect of at least one half can be obtained, as compared with the case where the light absorption layer is thick enough.

In one embodiment of the present invention, a thickness of the insulating layer is 20 nm or less.

In the semiconductor laser device of this embodiment, the thickness of the insulating layer included in the second side portions is 20 nm or less. If the thickness of this insulating layer is 20 nm or less, a light absorption effect of one half or more can be obtained, as compared with the case of the highest light absorption effect where the insulating layer is not provided.

In one embodiment of the present invention, the light absorption layer is of the opposite conductive type from a conductive type of the first upper clad layer.

In the semiconductor laser device of this embodiment, the light absorption layer is of the opposite conductive type from the conductive type of the first upper clad layer. Therefore, the possibility that an ineffective current may flow through the light absorption layer can be suppressed.

In one embodiment of the present invention, the light absorption layer has:

a first light absorption layer made from any one of Ge, Si, $Si_xGe_{1-x}$ (where $0 \leq x \leq 1$), GaAs, InGaAs, AlGaAs, InP, $(Al_xGa_{1-x})_yIn_{1-y}P$ ($0 \leq x \leq 1$, $0 \leq y \leq 0.5$) and InGaAs; and a second light absorption layer made from at least one of Ru, Os, Zr, Mo, W, Re, Zn, Fe, Sn, Ti, Cr, Sb, Ir, Mn, Pt and Pd.

In the semiconductor laser device of this embodiment, the light absorption layer includes a first light absorption layer made from the semiconductor material, and a second light absorption layer made from the metal material is provided on the first light absorption layer. According to this semiconductor laser device, ripples can be reduced without causing any ineffective current by virtue of the combination of the second light absorption layer made from a metal material having a large light absorption effect and the first light absorption layer made from a semiconductor material having a light absorption effect as well as a function of blocking an ineffective current.

In one embodiment of the present invention, the lower clad layer, the active layer, the first upper clad layer and the second upper clad layer are made of $(Al_xGa_{1-x})_yIn_{1-y}P$ ($0 \leq x \leq 1$, $0 \leq y \leq 1$), respectively.

In the semiconductor laser device of this embodiment, there can be implemented a red semiconductor laser device suitable for use with DVDs (Digital Versatile Discs) as an example.

In one embodiment of the present invention, the active layer includes a quantum well, and a window area in which the active layer is intermixed is formed in a proximity to a light-emission end face.

In the semiconductor laser device of this embodiment, the active layer includes a quantum well, and the window area in which the active layer is intermixed in vicinities of the light-emission end face is formed. Thus, even for scattered light due to the formation of the window area, the scattered light can be suppressed so that ripples of radiation light can be reduced.

According to the semiconductor laser device of the invention, the ridge portion forms a waveguide, and guided light goes along the ridge portion. A tail of the guided light is present also at the first side portions, while the second side portions are regions which the tail of the guided light does not reach.

Meanwhile, scattered light generated from the ridge portion goes through the first side portions, spreading into the second side portions. In the second side portions, a light absorption layer serving as a light absorber is formed on the first upper clad layer, where the scattered light is absorbed. As a result of the absorption of scattered light in the second side portions, ripples of radiation light are reduced.

Also, in this invention, since the light absorption layer and the electrode layer are in electrical contact with each other, the problem of charge accumulation to the light absorption layer can be avoided.

Consequently, according to the semiconductor laser device of the present invention, laser light having successful radiation light characteristics with less ripples can be emitted without causing occurrence of kinks even in high power operation. Thus, the semiconductor laser device of the present invention is excellent in focusing property for use with optical disks, behaves with less write/read errors, and suitable for operations to exert optical output control by using part of radiation light.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

Figure 1:
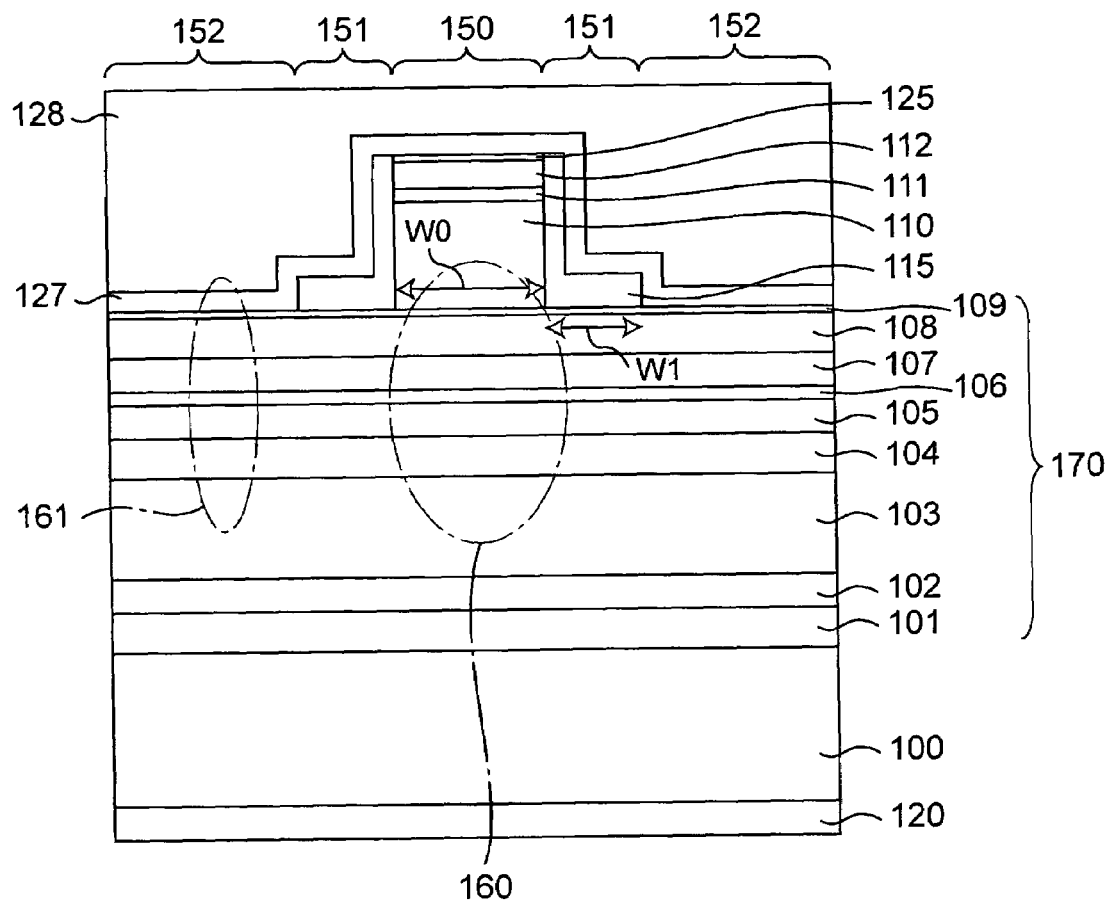
FIG. 1 is a sectional view showing a semiconductor laser device according to a first embodiment of the present invention.

Hereinbelow, the present invention is described in detail by embodiments thereof illustrated in the accompanying drawings. In the accompanying drawings, it is assumed that same reference numerals represent same parts or equivalent parts. Also, in some cases, herein, $(Al_xGa_{1-x})_yIn_{1-y}P$ ($0 \leq x \leq 1$, $0 \leq y \leq 1$) is abbreviated as AlGaInP, $Ga_zIn_{1-z}P$ ($0 \leq z \leq 1$) is abbreviated as GaInP, and $Al_rGa_{1-r}As$ ($0 \leq r \leq 1$) is abbreviated as AlGaAs.

FIRST EMBODIMENT

Figure 2:
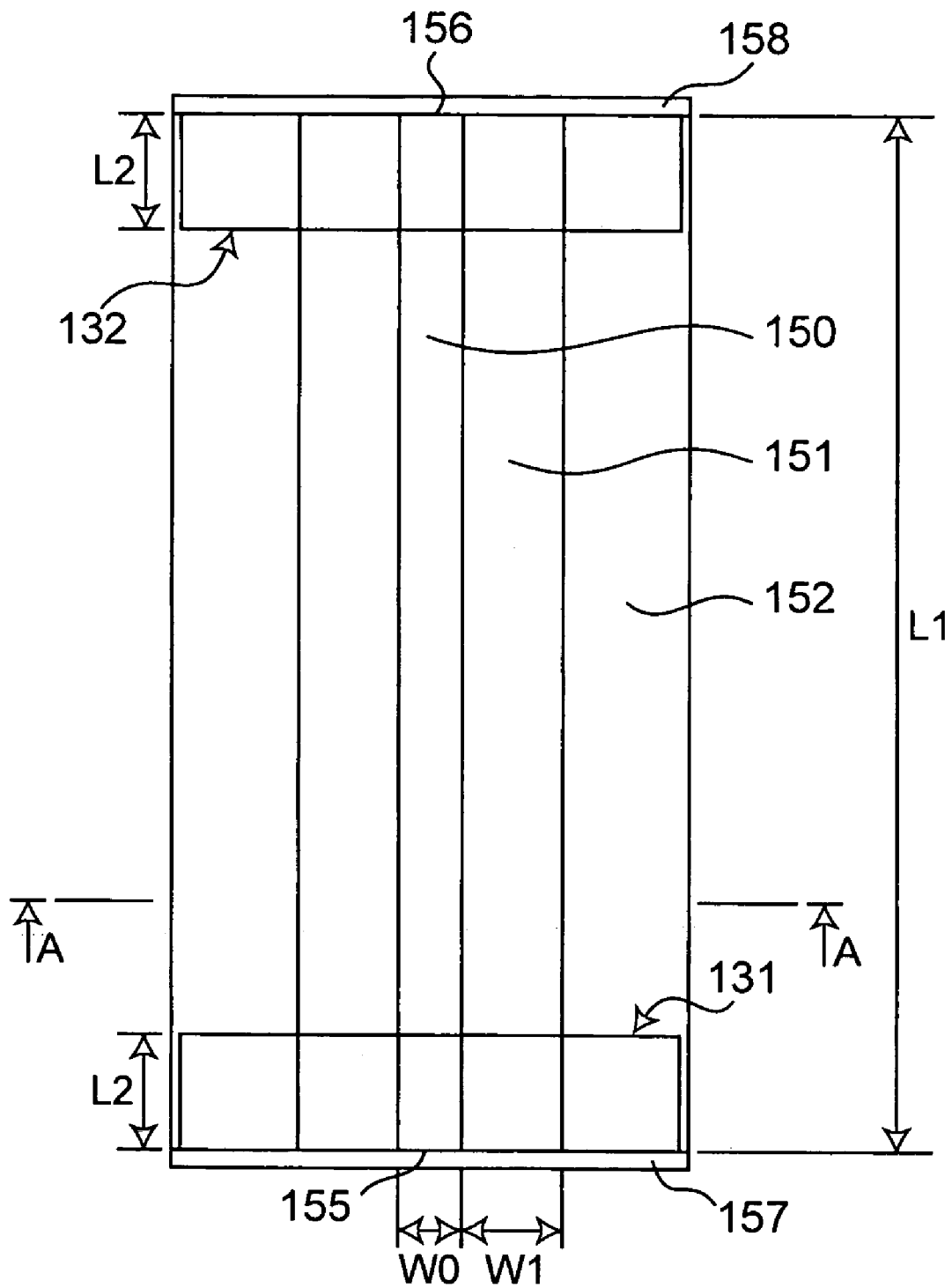
FIG. 2 is a top view showing the semiconductor laser device according to the first embodiment.

FIG. 1 shows a schematic cross section of a first embodiment of the semiconductor laser device of the invention. FIG. 2 shows a schematic top view of the first embodiment. The schematic sectional view of FIG. 1 shows a cross section taken along the line A-A of FIG. 2.

As shown in FIG. 1, the semiconductor laser device of the first embodiment has a ridge portion 150, first side portions 151 located on both outer sides of the ridge portion 150, and second side portions 152 located on both outer sides of the first side portions 151. A ridge foot width W0 of the ridge portion 150 is 1.6 μm as an example, and a width W1 of each first side portion 151 is 2.5 μm as an example.

The ridge portion 150, the first side portions 151, the second side portions 152 each include a semiconductor multilayered structure portion 170 formed on an n-type GaAs substrate 100.

In the semiconductor laser device, guided light is distributed in a range represented by a region 160 indicated by reference numeral 160 in FIG. 1. A lateral width of the guided light distribution region 160 is limited by the ridge foot width W0. Also, one-side ends of the first side portions 151 of the width W1 on one side closer to the second side portions 152 are set at positions which the tail of the guided light does not reach.

The semiconductor multilayered structure portion 170 is formed on the n-type GaAs substrate 100. In this semiconductor multilayered structure portion 170, an n-type GaAs buffer layer 101, an n-type $Ga_{0.5}In_{0.5}P$ buffer layer 102, a 2.0 μm thick n-type $(Al_{0.67}Ga_{0.33})_{0.5}In_{0.5}P$ first lower clad layer 103, a 0.2 μm thick n-type $(Al_{0.7}Ga_{0.3})_{0.5}In_{0.5}P$ second lower clad layer 104, a 0.05 μm thick undoped $(Al_{0.5}Ga_{0.5})_{0.5}In_{0.5}P$ lower guide layer 105, an undoped active layer 106 containing quantum-well-layer, a 0.05 μm thick undoped $(Al_{0.5}Ga_{0.5})_{0.5}In_{0.5}P$ upper guide layer 107, a 0.24 μm thick p-type $(Al_{0.7}Ga_{0.3})_{0.5}In_{0.5}P$ first upper clad layer 108, and a 0.01 μm thick p-type $Ga_{0.7}In_{0.3}P$ etching stop layer 109 are stacked on the n-type GaAs substrate 100 in this order.

In this case, the active layer 106 is formed of a 6 nm thick $Ga_{0.5}In_{0.5}P$ quantum well layer, a 5 nm $(Al_{0.5}Ga_{0.5})_{0.5}In_{0.5}P$ barrier layer, a 6 nm thick $Ga_{0.5}In_{0.5}P$ quantum well layer, a 5 nm thick $(Al_{0.5}Ga_{0.5})_{0.5}In_{0.5}P$ barrier layer and a 6 nm thick $Ga_{0.5}In_{0.5}P$ quantum well layer, these layers being stacked in this order as viewed from the n-type second lower clad layer 104.

Also, the second side portions 152 each have a 150 nm thick light absorption layer 127 made of Mo formed on the etching stop layer 109, and a 2 μm thick p-side electrode 128 made of Au is formed on the light absorption layer 127. With the structure of the second side portions 152, since the potential of the light absorption layer 127 is fixed to the p-side electrode 128, troubles of voltage instability and dielectric breakdown due to floating can be avoided.

The first side portions 151 each have a 0.2 μm thick buried layer 115 made of $SiO_2$ and formed on the etching stop layer 109, where the light absorption layer 127 and the p-side electrode 128 are formed in this order on the buried layer 115.

The ridge portion 150 has a 1.2 μm thick p-type $(Al_{0.7}Ga_{0.3})_{0.5}In_{0.5}P$ second upper clad layer 110 which protrudes upward from part of a surface of the etching stop layer 109. In the ridge portion 150, a 0.05 μm thick p-type $Ga_{0.5}In_{0.5}P$ intermediate band gap layer 111, a 0.5 μm thick p-type GaAs cap layer 112, a p-side AuZn ohmic electrode 125, a light absorption layer 127 and a p-side electrode 128 are formed on the second upper clad layer 110 in this order.

The light absorption layer 127 present on the etching stop layer 109 in the second side portions 152 is out of so-called ohmic contact regardless of its being a metal layer formed on the etching stop layer 109, which is a semiconductor film. Therefore, it hardly occurs that an electric current flows from the light absorption layer 127 toward the semiconductor multilayered structure 170.

Meanwhile, on the cap layer 112 in the ridge portion 150, where the p-side ohmic electrode 125 for fulfilling ohmic contact is formed, an electric current flows through the ridge portion 150.

Also, with regard to the n-type GaAs substrate 100, on the opposite surface to the one on which the semiconductor multilayered structure portion 170 is stacked an n-side electrode 120 is formed on one surface. The n-side electrode 120 is formed by stacking a AuGe layer, a Ni layer, a Mo layer and an Au layer in this order on the n-type substrate 100.

Further, as shown in FIG. 2, a front-face reflection film 157 is formed on a front light-emission end face 155 vertical to the surface of the n-type GaAs substrate 100, and a rear-face reflection film 158 is formed on a rear light-emission end face 156. The front-face reflection film 157 is an $Al_2O_3$ layer, its reflectivity being 8%. Also, the rear-face reflection film 158 on the rear light-emission end face 156 is formed by stacking of an $Al_2O_3$ layer, a Si layer, an $Al_2O_3$ layer, a Si layer and an $Al_2O_3$ layer in this order as viewed from the rear light-emission end face 156 side. The rear-face reflection film 158 has a reflectivity of 90%.

A resonator length L1 of the semiconductor laser device of the first embodiment is 1300 μm. In regions extending from the light-emission end faces 155, 156 to a length L2=15 μm, window areas 131, 132 are formed, respectively. In the case where these window areas 131, 132 are formed, waveguide characteristics are subject to changes between the window areas 131, 132 and the other regions, leading to occurrence of scattered light that would cause ripples. However, since ripples are suppressed in this embodiment, a window structure suitable for high power operation becomes adoptable without sacrificing the far field pattern.

The semiconductor laser device of this embodiment is manufactured in the following manner. That is, referring to FIG. 1, an n-type GaAs buffer layer 101, an n-type $Ga_{0.5}In_{0.5}P$ buffer layer 102, an n-type $(Al_{0.67}Ga_{0.33})_{0.5}In_{0.5}P$ first lower clad layer 103, an n-type $(Al_{0.7}Ga_{0.3})_{0.5}In_{0.5}P$ second lower clad layer 104, an undoped $(Al_{0.5}Ga_{0.5})_{0.5}In_{0.5}P$ lower guide layer 105, an undoped active layer 106 containing quantum-well-layer, an undoped $(Al_{0.5}Ga_{0.5})_{0.5}In_{0.5}P$ upper guide layer 107, a p-type $(Al_{0.7}Ga_{0.3})_{0.5}In_{0.5}P$ first upper clad layer 108, a p-type $Ga_{0.7}In_{0.3}P$ etching stop layer 109, a p-type $(Al_{0.7}Ga_{0.3})_{0.5}In_{0.5}P$ second upper clad layer 110, a p-type $Ga_{0.5}In_{0.5}P$ intermediate band gap layer 111, and a p-type GaAs cap layer 112 are stacked on the n-type GaAs substrate 100 in this order.

Next, on portions of the p-type GaAs cap layer 112 corresponding to the window areas 131, 132 shown in FIG. 2, a ZnO film and a $SiO_2$ film (not shown either) are formed and held at high temperatures, by which window areas 131, 132 having an intermixed active layer 106 and an intermixed etching stop layer 109 are formed. Then, the ZnO film and the $SiO_2$ film (not shown either) are removed.

Next, on top of the region that is to be the ridge portion 150, a $SiO_2$ film (not shown) as a mask is formed by photolithography and the p-type GaAs cap layer 112, the p-type intermediate band gap layer 111 and a part of the p-type second upper clad layer 110 are etched by dry etching process (ICP (Inductive Coupled Plasma) or RIBE (Reactive Ion Beam Etching) process etc.). Further, the second upper clad layer 110 in regions that are to be the first side portions 151 and the second side portions 152 is etched by a wet etchant (phosphoric acid or hydrochloric acid) which does not etch the etching stop layer 109. Thereafter, a buried film 115 made of $SiO_2$ is formed all over.

Next, the buried layer 115 on the p-type cap layer 112 in the ridge portion 150 located outside the field of the window areas 131 and 132 is removed, by which a p-side ohmic electrode 125 is formed. The buried layer 115 in the regions that are to be the second side portions 152 is removed, by which a light absorption layer 127 and a p-side electrode 128 are formed all over. Thereafter, as shown in FIG. 2, with the wafer cleaved, reflection films 157, 158 are formed on the resulting light-emission end faces 155, 156, respectively.

In the window areas 131, 132, since the buried layer 115 is formed on the p-type GaAs cap layer 112 (not shown), the possibility that an ineffective current may flow through the window areas 131, 132 is prevented.

Figure 3:
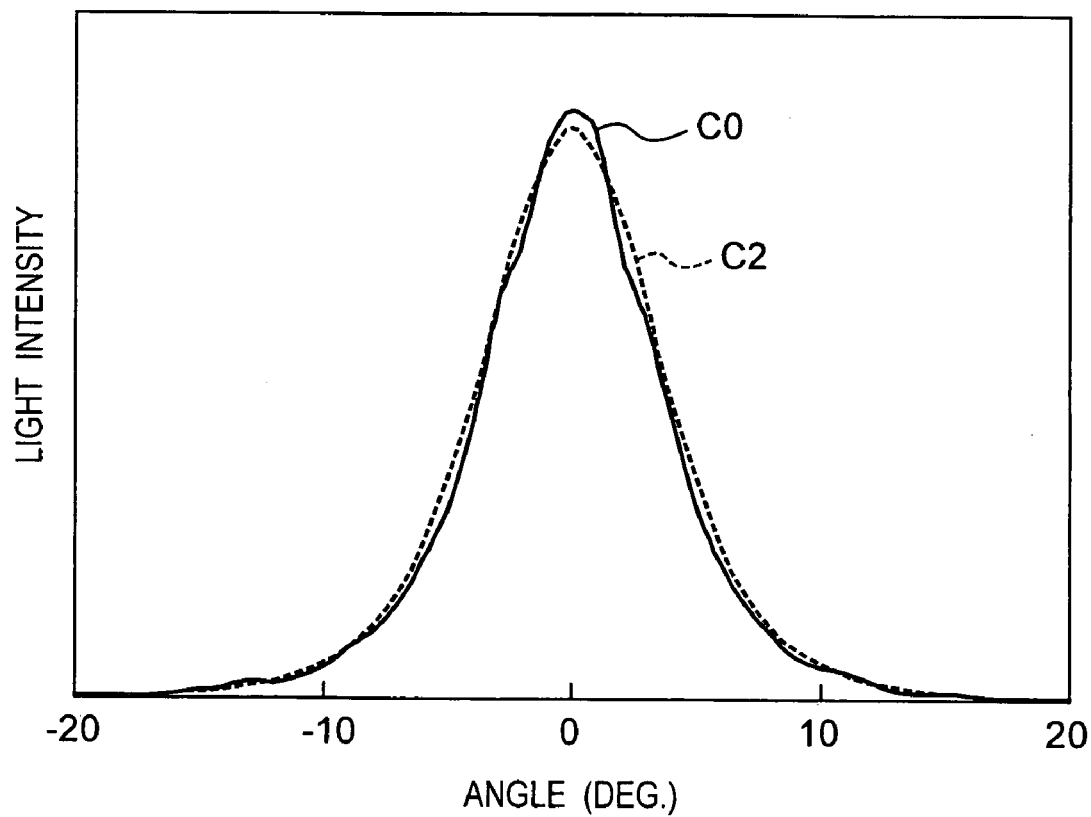
FIG. 3 is a chart showing a light intensity distribution of horizontal radiation light of the semiconductor laser device according to the first embodiment.
Figure 4:
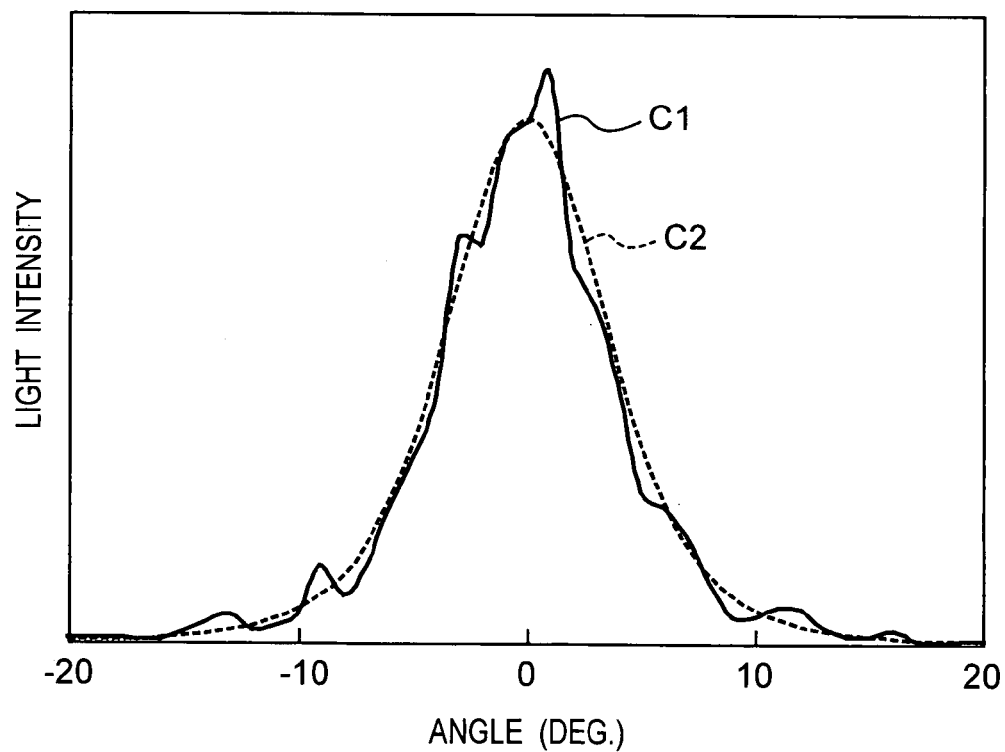
FIG. 4 is a chart showing ripples of horizontal radiation light in a comparative example of the semiconductor laser device according to the first embodiment.

A horizontal radiation light distribution in a typical semiconductor laser device according to the first embodiment is shown by a solid line C0 in FIG. 3. On the other hand, a horizontal radiation light distribution of a semiconductor laser device which is a comparative example equivalent in structure to the first embodiment except that the comparative example has no light absorption layer 127 shown in FIG. 1 is shown by a solid line C1 in FIG. 4. In FIGS. 3 and 4, a dotted line C2 is a horizontal radiation light distribution on the assumption that there are no ripples. While the value of ripples was about 13% in the comparative example as shown in FIG. 4, the value of ripples resulted in 4% in this embodiment as shown in FIG. 3 by virtue of including the light absorption layer 127. It is noted that the definition for the value of ripples will be described later in the explanation of FIG. 7.

The reason why the ripples decreased as shown above in this embodiment is as follows. As shown in FIG. 1, a distribution region 161 of scattered light that has departed from the guided light distribution region 160 has a top portion in contact with the light absorption layer 127, and the scattered light is absorbed by this light absorption layer 127. As a result of this, the scattered light damps in intensity, so that the intensity of scattered light at the light-emission ends can be suppressed low.

The semiconductor laser device of this embodiment, typically, is kink-free up to an optical output of 280 mW in pulsed operation, and its vertical radiation angle is 15°. Also, its horizontal radiation angle is 9° for an output of 3 mW in CW (Continuous Wave) operation, and 11° for an output of 100 mW in CW operation. The emission wavelength is 658 nm, the threshold current is 50 mA, the characteristic temperature of the threshold current is 120K, the differential quantum efficiency is 1.1 W/A, and the semiconductor laser device is capable of operating for 3000 hours or more at 70° C. with an optical output of 240 mW (with a pulse width of 50 ns and a duty of 50%).

In addition, the light absorption layer 127 that serves as a light absorber may be implemented by using not only Mo but also metals or semiconductors described in the paragraphs of the summary of the invention.

Figure 5:
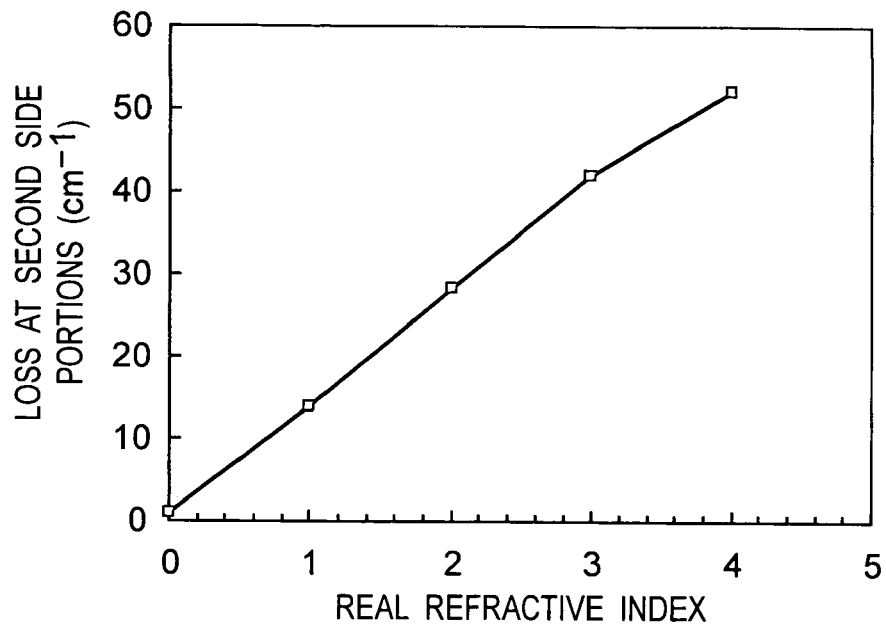
FIG. 5 is a chart showing changes of loss in a second side portion relating to a ripple reduction effect in a case where the refractive index of a light absorption layer 127 is varied in the semiconductor laser device according to the first embodiment.

Next, a result of calculating the way how the loss in the second side portions 152 relating to the light absorption effect varies with variations in real refractive index (real part of complex refractive index) of the material is shown in FIG. 5. In this calculation, the imaginary part of the complex refractive index was assumed as constant. Actually, the greater the imaginary part of the complex refractive index, the greater the light absorption effect. Accordingly, it is not necessarily required that the refractive index in this calculation be equal to or higher than a certain level, but it can be understood that the greater the refractive index in the calculation, the higher the light absorption effect. In the calculation example shown in FIG. 5, materials having a refractive index of 2 or higher, which corresponds to about half that of Mo, is preferable.

Figure 6:
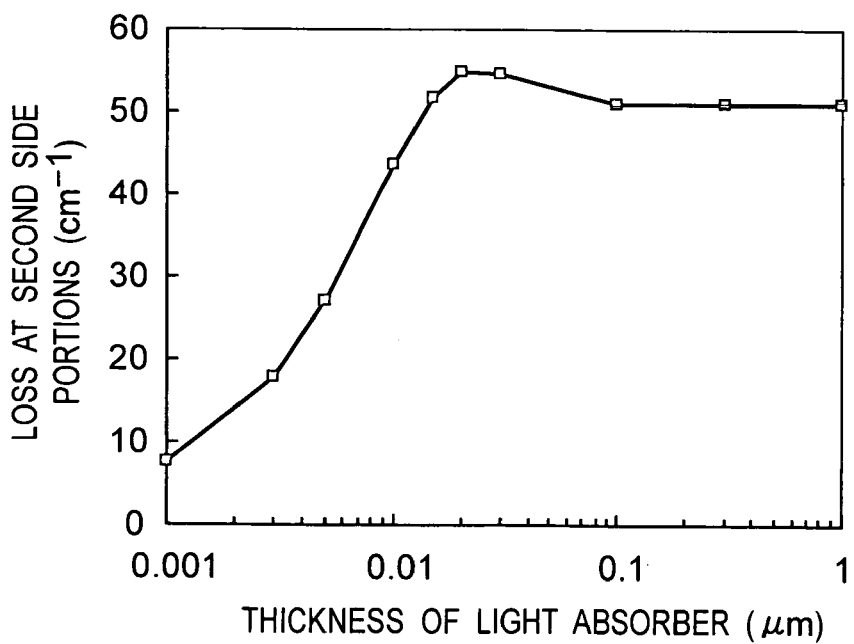
FIG. 6 is a chart showing a relationship between the thickness of the light absorption layer 127 and the loss in the second side portion relating to the ripple reduction effect in the semiconductor laser device according to the first embodiment.

Next, a calculation result for determining an optimum thickness of the light absorption layer 127 is shown in FIG. 6. As shown in FIG. 6, given enough thickness of the light absorption layer 127, the loss becomes 50 cm$^{-1}$. It can be seen that if the thickness of the light absorption layer 127 is 5 nm or more, the resulting loss is equal to or higher than one half that of the case where the light absorption layer 127 is thick enough. Also, with the thickness of the light absorption layer 127 within a range of 15 nm to 100 nm, the loss becomes the greatest due to the light interference effect.

Figure 7:
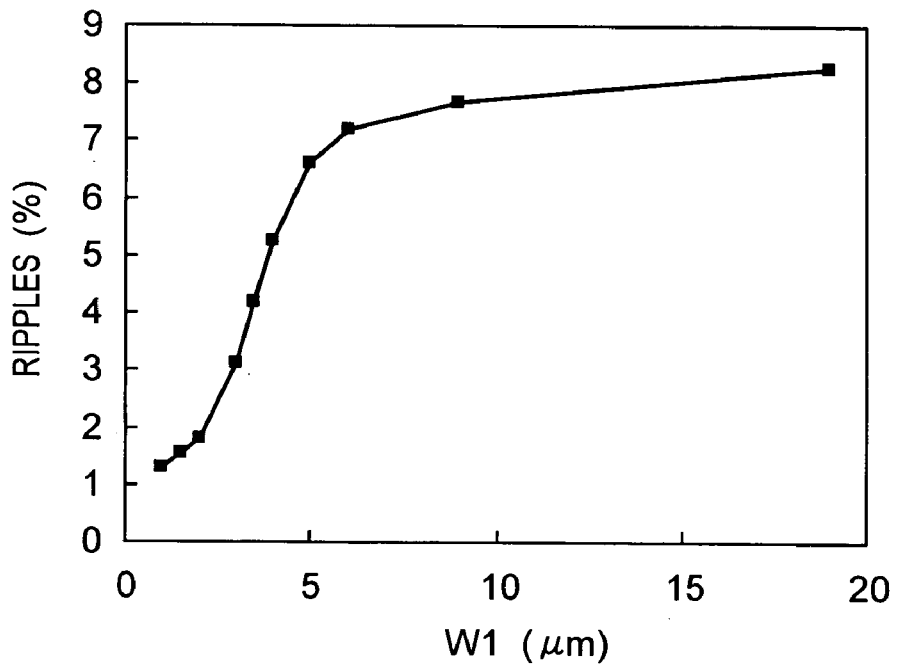
FIG. 7 is a chart showing a relationship between the width W1 of a first side portion and ripples of horizontal radiation light in the semiconductor laser device according to the first embodiment.

Next, an optimization calculation was performed with respect to the width W1 of the first side portions 151. In this calculation, the value of ripples was given by one obtained through a calculation that a sum of absolute values of differences between cases where the horizontal radiation light is free from ripples and not was divided by an area (emission surface) in the case where no ripples are involved. As shown in FIG. 7, the result of this calculation is that the value of ripples decreases with the width W1 of the first side portions 151 equal to or lower than 9 μm, an effect appears particularly with the width W1 equal to or lower than 5 μm, and the value of ripples decreases by one half with the width W1 equal to or lower than 3.5 μm.

Figure 8:
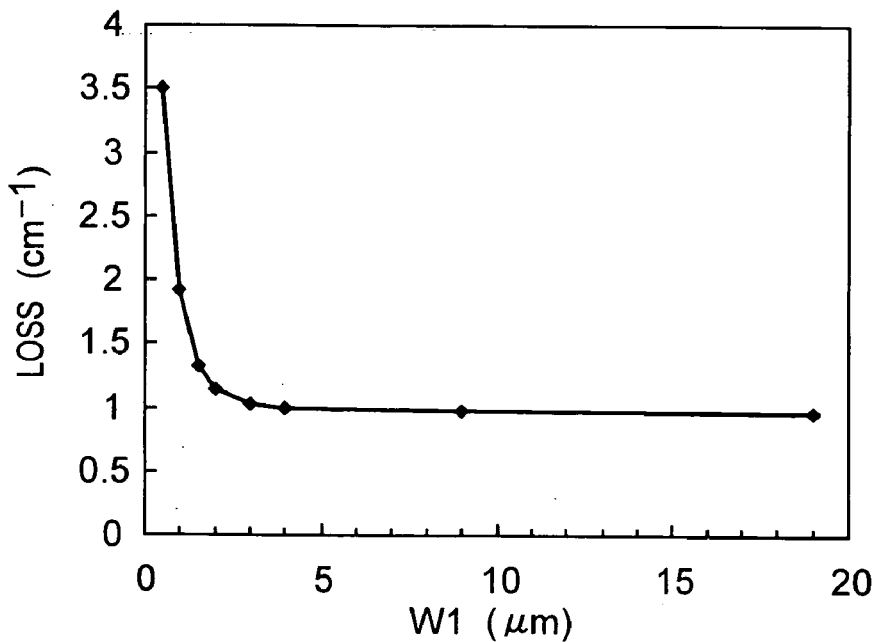
FIG. 8 is a chart showing a relationship between the width W1 of the first side portion and the loss of guided light in the semiconductor laser device according to the first embodiment.

On the other hand, as shown in FIG. 8, the value of guided light loss is as small as 1 cm$^{-1}$ with the width W1 equal to or lower than 4 μm, while the value increases up to a proximity to 2 cm$^{-1}$ with the width W1 equal to 1 μm, and the value becomes so large as 3.5 cm$^{-1}$ with the width W1 equal to 0.5 μm.

Accordingly, the value of the width W1 of the first side portions 151 is desirably 1 μm to 5 μm, more preferably 1.5 μm to 5 μm, and further preferably 2 μm to 3.5 μm.

The ridge side faces of the ridge portion 150, although depicted as if they were vertical to the substrate surface in FIG. 1, are actually slightly slanted against the substrate surface in usual cases. In such a case also, the width W0 of the ridge portion 150 is defined as a width of a portion at which the second upper clad layer 110 is in contact with the etching stop layer 109. Also, the width W1 of the first side portions 151 is defined as a width of a portion at which the buried layer 115 is in contact with the etching stop layer 109. Further, the second side portions 152 are defined as regions at which the light absorption layer 127 is in contact with the etching stop layer 109 or upper clad layer 108.

SECOND EMBODIMENT

Figure 9:
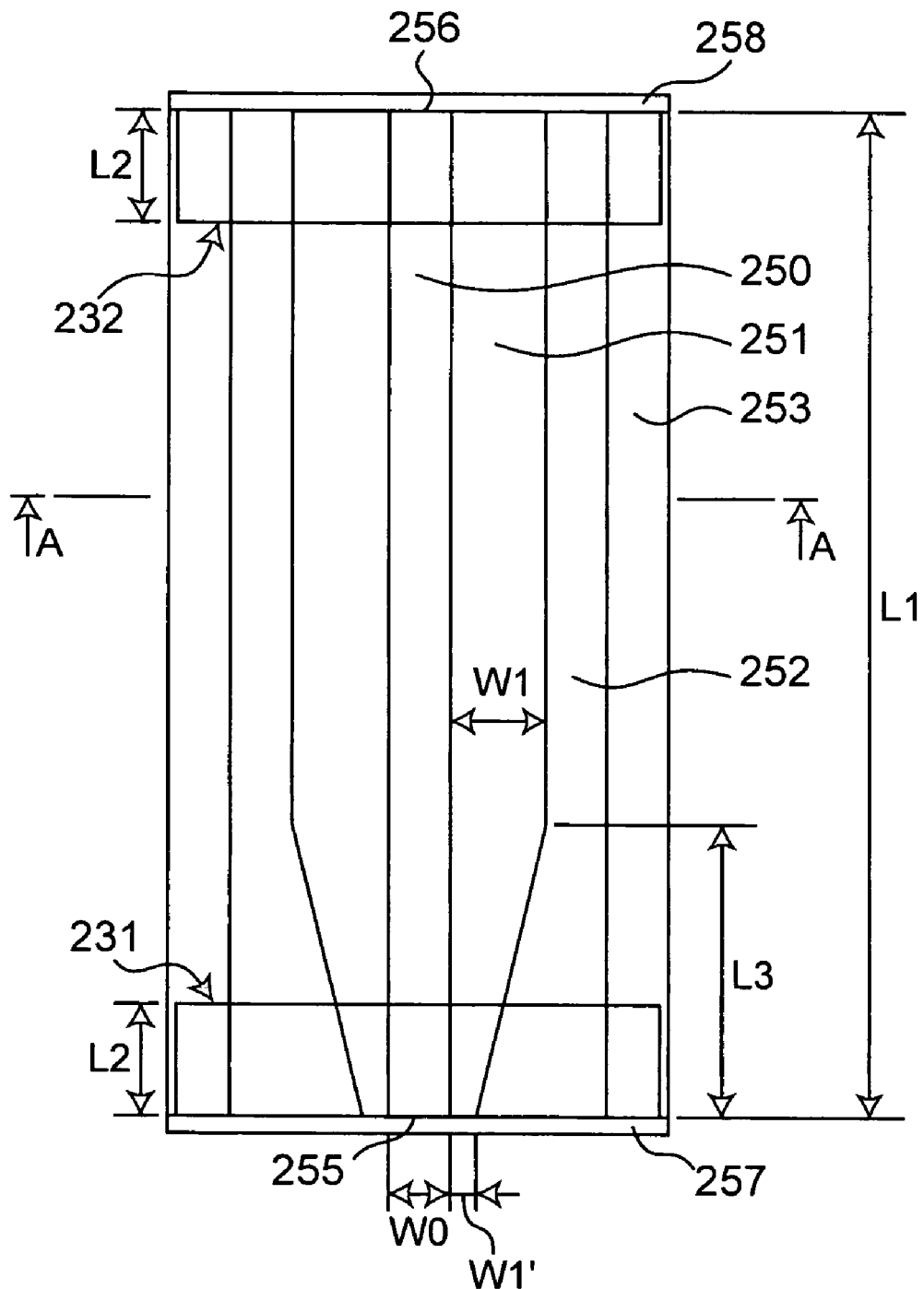
FIG. 9 is a top view showing a semiconductor laser device according to a second embodiment of the invention.
Figure 10:
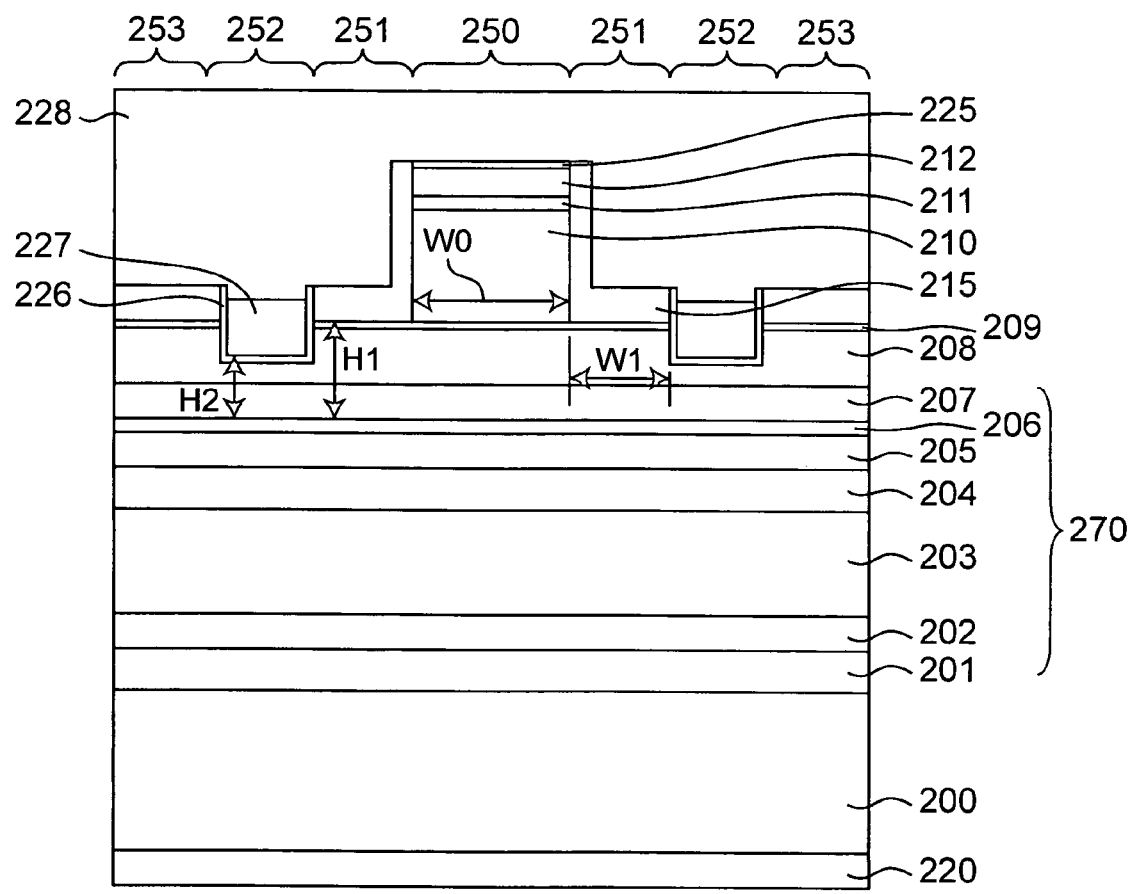
FIG. 10 is a sectional view showing the semiconductor laser device according to the second embodiment.

Next, FIG. 9 shows a schematic top view of a second embodiment of the semiconductor laser device of the present invention. FIG. 10 shows a schematic cross section of the second embodiment, being a sectional view taken along the line A-A of FIG. 9.

The semiconductor laser device of this second embodiment includes, as shown in FIG. 10, a ridge portion 250, second side portions 252, and third side portions 253. As shown in FIG. 9, in regions extending from a front light-emission end face 255 and a rear light-emission end face 256 to a length L2=15 μm, window areas 231, 232 are formed, respectively. The second side portions 252, as shown in FIG. 9, are very close to the ridge portion 250 in vicinities of the front light-emission end face 255 as its distance thereto is approximately 1 μm as an example, where the width W1' of each first side portion 251 is about 1 μm as an example.

Meanwhile, in the interior separated away from the front light-emission end face 255 by a length L3=50 μm or more therefrom, the width W1 of the first side portions 251 was set to 2.5 μm. As a result of this, scattering that would cause radiation light ripples is removed particularly effectively in the vicinities of the front light-emission end face 255 without increasing the light absorption loss.

In the semiconductor laser device of the second embodiment, as shown in FIG. 10, the ridge portion 250, the first side portions 251, the second side portions 252 and the third side portions 253 each have a semiconductor multilayered structure portion 270 formed on an n-type GaAs substrate 200.

More specifically, the semiconductor multilayered structure portion 270 is so constructed that an n-type GaAs buffer layer 201, an n-type $Ga_{0.5}In_{0.5}P$ buffer layer 202, a 2.0 μm thick n-type $(Al_{0.67}Ga_{0.33})_{0.5}In_{0.5}P$ first lower clad layer 203, a 0.2 μm thick n-type $(Al_{0.7}Ga_{0.3})_{0.5}In_{0.5}P$ second lower clad layer 204, a 0.05 μm thick undoped $(Al_{0.5}Ga_{0.5})_{0.5}In_{0.5}P$ lower guide layer 205, an undoped active layer 206 containing quantum-well-layer, and an undoped $(Al_{0.5}Ga_{0.5})_{0.5}In_{0.5}P$ upper guide layer 207 are stacked on the n-type GaAs substrate 200 in this order.

In the second side portions 252, a p-type $(Al_{0.7}Ga_{0.3})_{0.5}In_{0.5}P$ first upper clad layer 208 (thickness 0.08 μm), a $Si_3N_4$ insulating layer 226 (thickness 2 nm), a Ti light absorption layer 227 (thickness 0.2 μm), and a p-side electrode 228 (thickness 3 μm) made of Au are formed on the semiconductor multilayered structure portion 270. In this embodiment, a distance H2 from an upper end of the active layer 206 to a lower end of the light absorption layer 227 in the second side portions 252 is 0.132 μm.

In the first side portions 251, a p-type $(Al_{0.7}Ga_{0.3})_{0.5}In_{0.5}P$ first upper clad layer 208 (thickness 0.27 μm), a p-type $Ga_{0.7}In_{0.3}P$ etching stop layer 209 (thickness 0.01 μm), a $Si_3N_4$ buried layer 215, and a p-side electrode 228 are formed on the semiconductor multilayered structure portion 270. In this embodiment, a distance H1 from an upper end of the active layer 206 to a lower end of the buried layer 215 in the first side portions 251 is 0.33 μm. Also, the third side portions 253 are similar in layer construction to the first side portions 251.

In the ridge portion 250, a 0.27 μm thick p-type $(Al_{0.7}Ga_{0.3})_{0.5}In_{0.5}P$ first upper clad layer 208, a 1.2 μm thick p-type $(Al_{0.7}Ga_{0.3})_{0.5}In_{0.5}P$ second upper clad layer 210 protruding upward from part of a surface of the 0.01 μm thick p-type $Ga_{0.7}In_{0.3}P$ etching stop layer 209, a 0.05 μm thick p-type $Ga_{0.5}In_{0.5}P$ intermediate band gap layer 211, a p-type GaAs cap layer 212, a p-side AuZn ohmic electrode 225 and a p-side electrode 228 are formed in this order on the semiconductor multilayered structure portion 270.

Also, in the n-type GaAs substrate 200, an n-side electrode 220 is formed on one surface other than the surface on which the semiconductor multilayered structure portion 270 is stacked.

Further, as shown in FIG. 9, a front-face reflection film 257 and a rear-face reflection film 258 are formed on light-emission end faces 255, 256 vertical to the surface of the n-type GaAs substrate 200, respectively.

In this second embodiment, the active layer 206 has the equivalent structure to the active layer 106 of the first embodiment, and the n-side electrode 220 has the equivalent structure to the n-type electrode 120. Also, the front-face reflection film 257 has the equivalent structure to the front-face reflection film 157 of the first embodiment, and the rear-face reflection film 258 has the equivalent structure to the rear-face reflection film 158 of FIG. 1.

The semiconductor laser device of this second embodiment is manufactured in the following manner. First, an n-type GaAs buffer layer 201, an n-type $Ga_{0.5}In_{0.5}P$ buffer layer 202, an n-type $(Al_{0.67}Ga_{0.33})_{0.5}In_{0.5}P$ first lower clad layer 203, an n-type $(Al_{0.7}Ga_{0.3})_{0.5}In_{0.5}P$ second lower clad layer 204, an undoped $(Al_{0.5}Ga_{0.5})_{0.5}In_{0.5}P$ lower guide layer 205, an undoped active layer 206 containing quantum-well-layer, an undoped $(Al_{0.5}Ga_{0.5})_{0.5}In_{0.5}P$ upper guide layer 207, a p-type $(Al_{0.7}Ga_{0.3})_{0.5}In_{0.5}P$ first upper clad layer 208, a p-type $Ga_{0.7}In_{0.3}P$ etching stop layer 209, a p-type $(Al_{0.7}Ga_{0.3})_{0.5}In_{0.5}P$ second upper clad layer 210, a p-type $Ga_{0.5}In_{0.5}P$ intermediate band gap layer 211, and a p-type GaAs cap layer 212 are formed on the n-type GaAs substrate 200 in this order.

Next, as shown in FIG. 9, on the cap layer 212 present on regions that are to be the window areas 231, 232 having a length L2=15 μm from the front-and-rear light-emission end faces 255, 256, a ZnO film and a $SiO_2$ film (not shown either) are formed and held at high temperatures, by which window areas 231, 232 having an intermixed active layer 206 and an intermixed etching stop layer 209 are formed.

Next, on top of the ridge portion 250, a $SiO_2$ film (not shown) as a mask is formed by photolithography, and the first, second and third side portions 251, 252, 253 are etched with the second upper clad layer 210 slightly left by dry etching process, and succeedingly etched up to the etching stop layer 209 by a wet etchant (phosphoric acid or hydrochloric acid) which stops at the etching stop layer 109. Subsequently, a buried layer 215 is formed all over, and unnecessary portions of the buried layer 215 in regions that are to be the ridge portion 250 and the second side portions 252 is removed.

For regions that are to be the second side portions 252, the etching stop layer 209 and part of the first upper clad layer 208 are etched. As a result of this, a distance H2 from an upper end of the active layer 206 to a lower end of the light absorption layer 227 in the second side portions 252 is made shorter than a distance H1 from an upper end of the active layer 206 to a lower end of the buried layer 215 in the first side portions 251.

Then, after an insulating layer 226 and a light absorption layer 227 are formed all over, the insulating layer 226 and the light absorption layer 227 formed in regions located outside the field of the second side portions 252 are removed by etching.

Next, a p-side ohmic electrode 225 is formed on the ridge portion 250. Further, a p-side electrode 228 is formed all over the p-side surface. Meanwhile, an n-side electrode 220 is formed on the substrate side.

Next, with the wafer cleaved, reflection films 257, 258 are formed on the resulting light-emission end faces 255, 256, respectively. In the window areas 231, 232, the buried layer 215 is formed on the p-type GaAs cap layer 212 (not shown). Therefore, the possibility that an ineffective current may flow through the window areas 231, 232 is prevented.

In the second side portions 252, the first upper clad layer 208 may be completely removed. In this case, the distance H2 from the upper end of the active layer 206 to the lower end of the light absorption layer 227 in the second side portions 252 results in a value obtained by adding a thickness of the upper guide layer 207 and a thickness of the insulating layer 226 (H2=thickness of upper guide layer 207+thickness of insulating layer 226). Further, in this case, since the undoped $(Al_{0.5}Ga_{0.5})_{0.5}In_{0.5}P$ upper guide layer 207 is set to a Al composition ratio lower than that of the first upper clad layer 208, the etching rate considerably lowers in this upper guide layer 207 so that the upper guide layer 207 is scarcely etched, thus the distance H2 being stabilized.

In addition, although Ti is used as the light absorption layer 227 in the second embodiment, yet other metals or semiconductors described in the paragraphs of the summary of the invention may also be used. Also in this second embodiment, since the light absorption layer 227 is formed after etching of the first upper clad layer 208 in the second side portions 252, the light absorption effect is enhanced and ripples in radiation light are reduced, as compared with the foregoing first embodiment. Further in this second embodiment, since the light absorption layer 227 is formed on the insulating layer 226 and moreover the third side portions 253 are provided so as to prevent the light absorption layer 227 from being exposed even on both side faces of the chip, leakage currents involved in the formation of the light absorption layer 227 directly on the semiconductor film can reliably be prevented.

The insulating layer 226 is not necessarily required in the case where no ineffective current occurs even if the light absorption layer 227 is formed directly on the etching stop layer 209. However, the fear for ineffective currents is lessened by the provision of the insulating layer 226.

Figure 11:
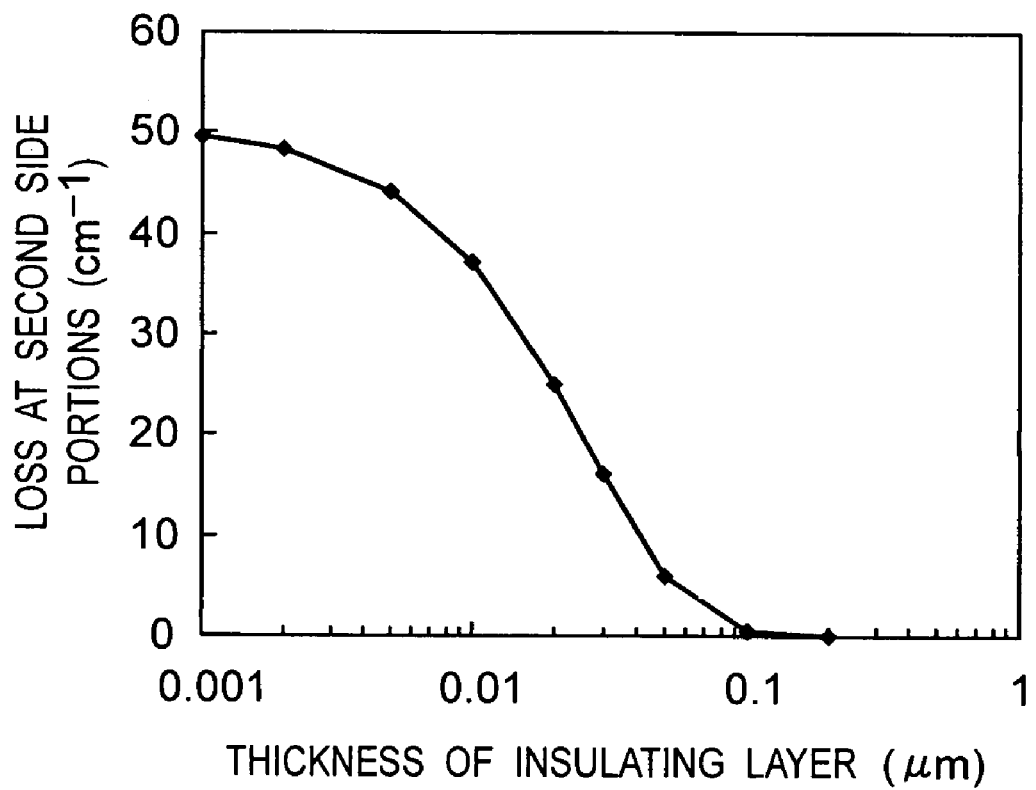
FIG. 11 is a chart showing a relationship between the width of an insulating layer 226 and the loss in the second side portion relating to the ripple reduction effect in the semiconductor laser device according to the second embodiment.

A result of calculating the dependence of the loss in the second side portions 252 on the thickness of the insulating layer 226 is shown in FIG. 11. As shown in FIG. 11, if the thickness of the insulating layer 226 is 20 nm or less, the quantity of loss in the second side portions 252 by the effect of the light absorption layer 227 becomes one half or more that of the case where the insulating layer 226 is not provided, preferably. Also, if the thickness of the insulating layer 226 is 10 nm or less, the loss results in 75% or more of that of the case where the insulating layer is not provided, further preferably. If the thickness of the insulating layer 226 is 5 nm or less, the loss results in 89% or more of that of the case where the insulating layer not provided, even more desirably.

Although the width W1' of each first side portion 251 at the front light-emission end face 255 is set to 1 μm in this embodiment, setting the width W1'=0 in the window area 231 and eliminating the second side portions 252 makes it possible to suppress the ripples even more effectively. In this case, the loss of guided light is 8.7 $cm^{-1}$, which results from calculating a weighted average of a loss of about 50 $cm^{-1}$ at the second side portions 252 and a loss of 0.3 $cm^{-1}$ at the ridge portion 250. Accordingly, the loss only at the window area 231 results in as small a value as 0.1 cm$^{-1}$ from a calculation of multiplying 8.7 cm$^{-1}$ by a length ratio L2/L1 (=15 μm/1300 μm).

THIRD EMBODIMENT

Figure 12:
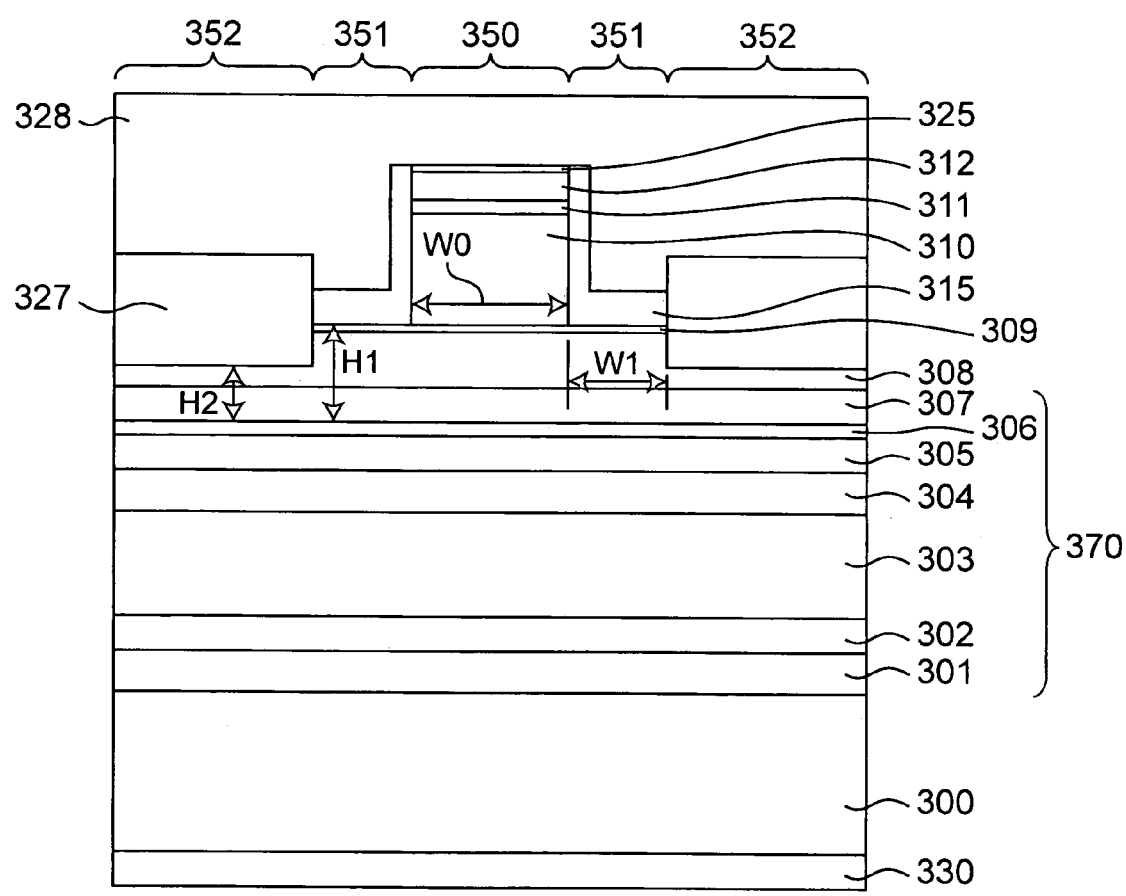
FIG. 12 is a sectional view showing a semiconductor laser device according to a third embodiment of the invention.

Next, FIG. 12 shows a schematic sectional view of a third embodiment of the semiconductor laser device of the invention.

The semiconductor laser device of the third embodiment has a ridge portion 350, first side portions 351 located on both outer sides of the ridge portion 350, and second side portions 352 located on both outer sides of the first side portions 351.

In each of the ridge portion 350, the first side portions 351 and the second side portions 352, a semiconductor multilayered structure portion 370 is formed on an n-type GaAs substrate 300.

In this semiconductor multilayered structure portion 370, layers of an n-type GaAs buffer layer 301 to an undoped $(Al_{0.5}Ga_{0.5})_{0.5}In_{0.5}P$ upper guide layer 307 which have the equivalent structure to the layers 101 to 107 in FIG. 1 are formed in this order on the n-type GaAs substrate 300.

Also, in the second side portions 352, a 0.08 μm thick p-type $(Al_{0.7}Ga_{0.3})_{0.5}In_{0.5}P$ first upper clad layer 308, a 0.2 μm thick light absorption layer 327 made of amorphous Si, and a p-side electrode 328 are formed on the semiconductor multilayered structure portion 370. A distance H2 from an upper end of an active layer 306 to a lower end of the light absorption layer 327 in the second side portions 352 is 0.13 μm.

Also, in the first side portions 351, a 0.27 μm thick p-type $(Al_{0.7}Ga_{0.3})_{0.5}In_{0.5}P$ first upper clad layer 308, a 0.01 μm thick p-type $Ga_{0.7}In_{0.3}P$ etching stop layer 309, a $Si_3N_4$ buried layer 315 and a p-side electrode 328 are formed on the semiconductor multilayered structure portion 370. A distance H1 from an upper end of the active layer 306 to a lower end of the buried layer 315 in the first side portions 351 is 0.33 μm.

In the ridge portion 350, a 0.27 μm thick p-type $(Al_{0.7}Ga_{0.3})_{0.5}In_{0.5}P$ first upper clad layer 308, a 1.2 μm thick p-type $(Al_{0.7}Ga_{0.3})_{0.5}In_{0.5}P$ second upper clad layer 310 protruding upward from part of a surface of the 0.01 μm thick p-type $Ga_{0.7}In_{0.3}P$ etching stop layer 309, a 0.05 μm thick p-type $Ga_{0.5}In_{0.5}P$ intermediate band gap layer 311, a 0.5 μm thick p-type GaAs cap layer 312, a p-side ohmic electrode 325 and a p-side electrode 328 are formed in this order on the semiconductor multilayered structure portion 370.

Also, in the n-type GaAs substrate 300, an n-side electrode 330 is formed on one surface other than the surface on which the semiconductor multilayered structure portion 370 is stacked.

In this case, the buried layer 315 has the equivalent structure to the buried layer 115 made of $SiO_2$ shown in FIG. 1, and the active layer 306 has the equivalent structure to the undoped active layer 106 containing quantum-well-layer shown in FIG. 1. Also, the p-side ohmic electrode 325 has the equivalent structure to the p-side ohmic electrode 125 shown in FIG. 1, the p-side electrode 328 has the equivalent structure to the p-side electrode 128, and the n-side electrode 320 has the equivalent structure to the n-side electrode 120.

The semiconductor laser device of this third embodiment is manufactured in the following manner. First, an n-type GaAs buffer layer 301, an n-type $Ga_{0.5}In_{0.5}P$ buffer layer 302, an n-type $(Al_{0.67}Ga_{0.33})_{0.5}In_{0.5}P$ first lower clad layer 303, an n-type $(Al_{0.7}Ga_{0.3})_{0.5}In_{0.5}P$ second lower clad layer 304, an undoped $(Al_{0.5}Ga_{0.5})_{0.5}In_{0.5}P$ lower guide layer 305, an undoped active layer 306 containing quantum-well-layer, an undoped $(Al_{0.5}Ga_{0.5})_{0.5}In_{0.5}P$ upper guide layer 307, a p-type $(Al_{0.7}Ga_{0.3})_{0.5}In_{0.5}P$ first upper clad layer 308, a p-type $Ga_{0.7}In_{0.3}P$ etching stop layer 309, a p-type $(Al_{0.7}Ga_{0.3})_{0.5}In_{0.5}P$ second upper clad layer 310, a p-type $Ga_{0.5}In_{0.5}P$ intermediate band gap layer 311, and a p-type GaAs cap layer 312 are formed on an n-type GaAs substrate 300 in this order.

Figure 13:
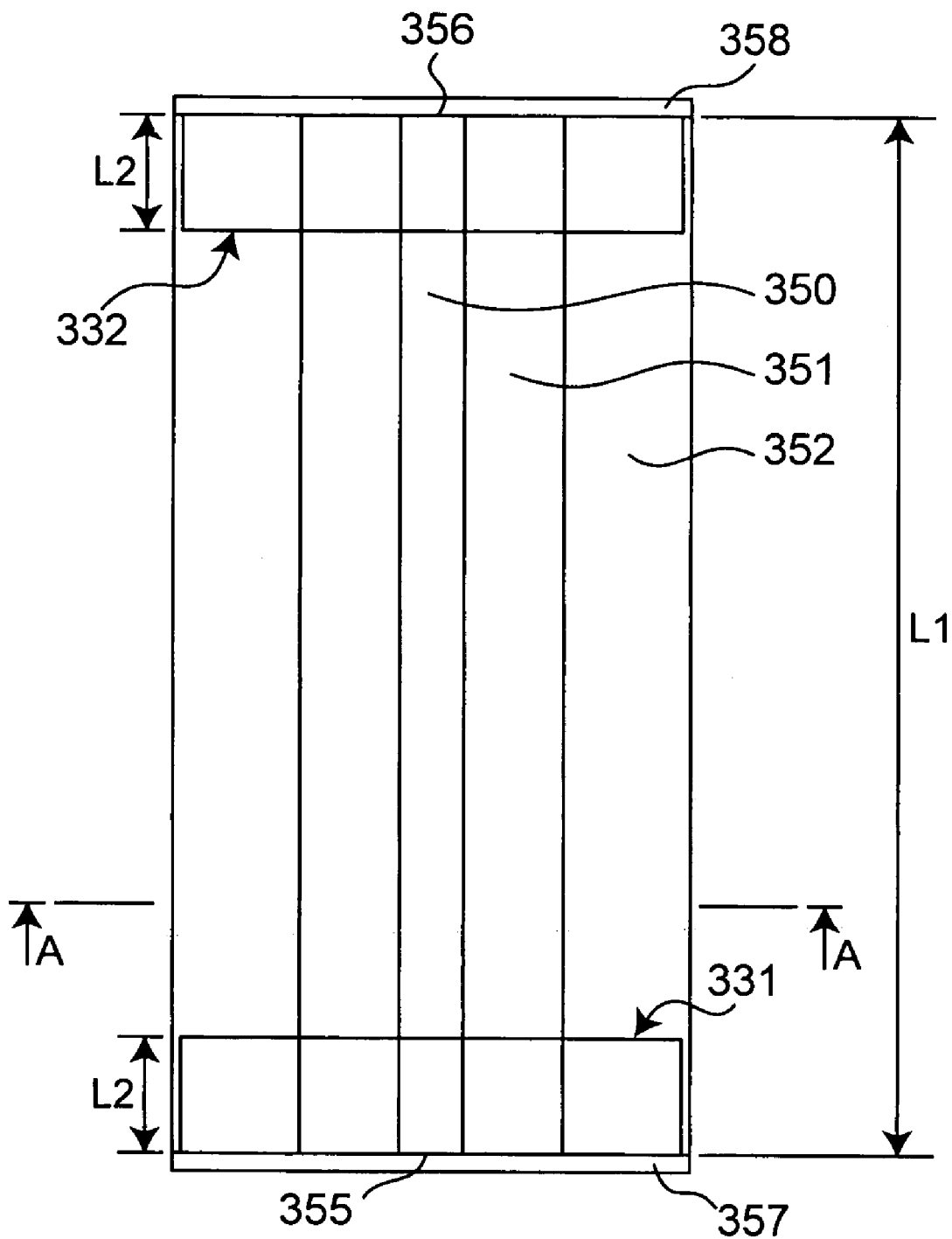
FIG. 13 is a top view showing the semiconductor laser device according to the third embodiment.
Figure 14:
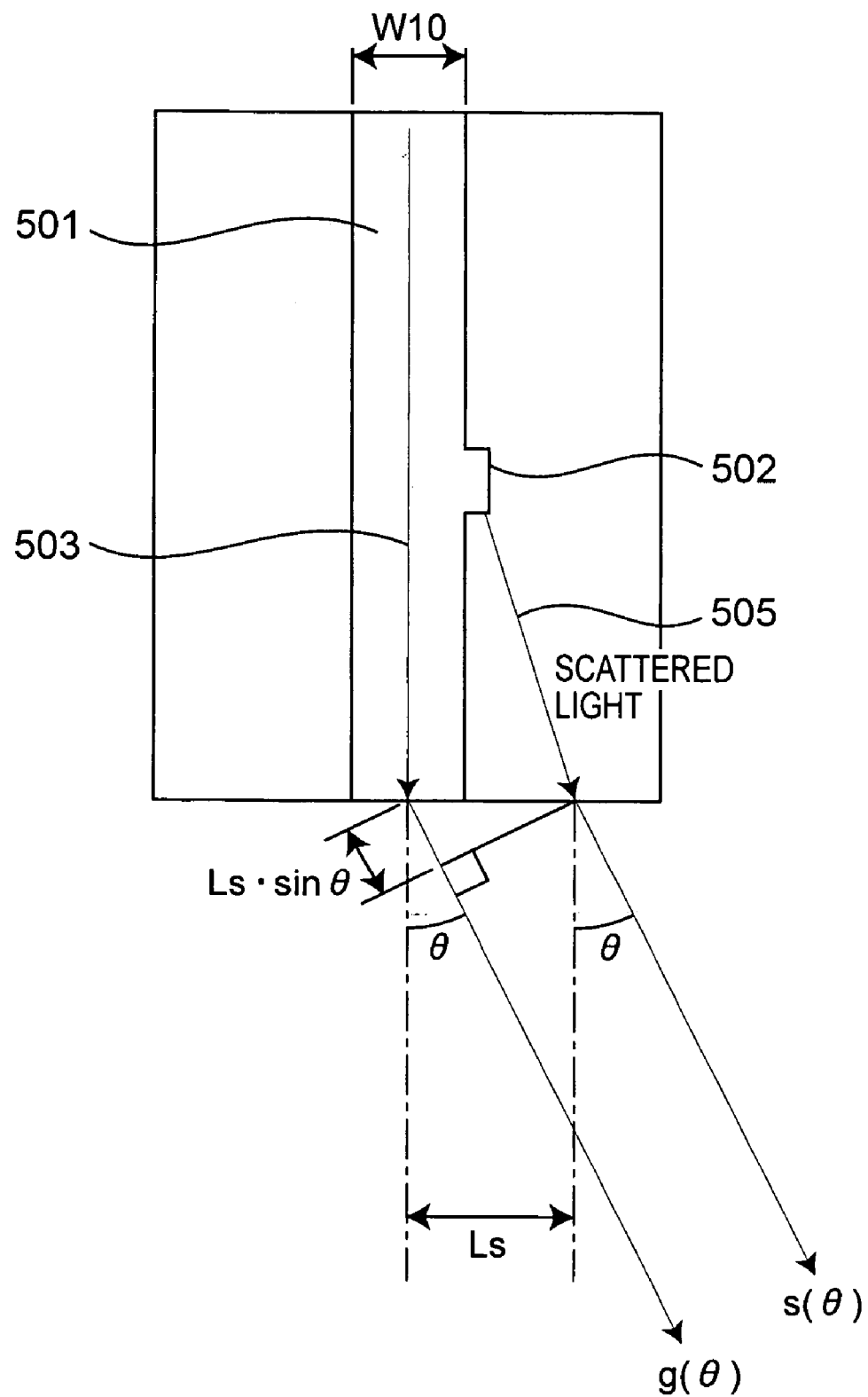
FIG. 14 is a view for explaining the principle of the occurrence of radiation light ripples in a semiconductor laser device according to the prior art.

Next, as shown in FIG. 13, which is a schematic top view, on the p-type GaAs cap layer 312 present on regions that are to be the window areas 331, 332, i.e., on regions that extend from the front-and-rear light-emission end faces 355, 356 by a length L2 (=15 μm), a ZnO film and a $SiO_2$ film (not shown either) are formed and held at high temperatures, by which window areas 331, 332 having an intermixed active layer 306 and an intermixed etching stop layer 309 are formed.

Next, on top of a region that is to be the ridge portion 350, a $SiO_2$ film (not shown) as a mask is formed by photolithography, and the regions that are to be the first, second side portions 351, 352 are etched with the second upper clad layer 310 slightly left by dry etching process, and succeedingly etched up to the etching stop layer 309 by a wet etchant (phosphoric acid or hydrochloric acid) which does not etch the etching stop layer 309.

Next, a buried layer 315 is formed all over. Thereafter, the buried layer 315, the etching stop layer 309 and part of the upper clad layer 308 are etched for regions that are to be the second side portions 352. As a result of this, the distance H2 in the regions that are to be the second side portions 352 is made smaller than the distance H1 in the first side portions 351. This distance H2 is a distance from the upper end of the undoped active layer 306 to the lower end of the light absorption layer 327. Also, the distance H1 is a distance from the upper end of the undoped active layer 306 to the lower end of the buried layer 315.

After the light absorption layer 327 is formed on the surface on which the first upper clad layer 308 has been etched, portions of the light absorption layer 327 formed in regions other than the regions that are to be the second side portions 352 are removed by etching. Thereafter, the buried layer 315 in the region that is to be the ridge portion 350 is removed, and then a p-side ohmic electrode 325 is formed. Further, a p-side electrode 328 is formed all over the p-side surface. An n-side electrode 320 is formed on the substrate 300 side.

Next, with the wafer cleaved, reflection films 357, 358 are formed on the resulting light-emission end faces 355, 356, respectively. In the window areas 331, 332, the buried layer 315 is formed on the p-type GaAs cap layer 312 (not shown). Therefore, the possibility that an ineffective current may flow through the window areas 331, 332 is prevented.

In the second side portions 352, the first upper clad layer 308 may be completely removed. In this case, the distance H2 in the second side portions 352 results in a value of H2=thickness of the upper guide layer 307. In this case, since the undoped $(Al_{0.5}Ga_{0.5})_{0.5}In_{0.5}P$ upper guide layer 307 is set to a Al composition ratio lower than that of the first upper clad layer 310, the etching rate considerably lowers in this upper guide layer 307 so that the upper guide layer 307 is scarcely etched, thus the thickness being stabilized.

In addition, although amorphous Si formed by PCVD process is used as the light absorption layer 327, yet such semiconductors as Ge, $Si_xGe_{1-x}$ ($0 \leq x \leq 1$), GaAs, InGaAs, AlGaAs, InP, $(Al_xGa_{1-x})_yIn_{1-y}P$ ($0 \leq x \leq 1$, $0 \leq y \leq 0.5$) and InGaAsP may also be used.

In this third embodiment, since the light absorption layer 327 is formed from semiconductor, an ineffective current is less likely to occur even without the provision of the insulating layer, as compared with the first embodiment, but it is preferable to apply such doping that the conductive type of the light absorption layer 327 does not become the p-type, by way of precaution.

Further, with the light absorption layer 327 formed from relatively thin semiconductor layer (e.g., 5 nm or less), another light absorption layer made of metal may be formed thereon. In this case, the light absorption effect can be enhanced so that ripples can be further reduced.

The etching stop layer, the first etching stop layer and the second etching stop layer are implemented each by a single layer in which grating strain is applied to suppress light absorption in the first, second and third embodiments. However, those layers may also be implemented each by a plurality of layers including a quantum well and a barrier layer. In such a case, the grating strain can be made weaker or completely eliminated. Also, although the etching stop layer, the first etching stop layer and the second etching stop layer are formed of GaInP containing no Al in the foregoing embodiments, yet those layers may be formed of AlGaInP containing Al, in which case the grating strain may be weakened.

Further, a plurality of quantum well layers are included in the active layer in the foregoing embodiments. Instead, the quantum well layer may be given in singularity. Although the Al composition ratios of the guide layer and the barrier layer are of the same in the foregoing embodiments, yet the Al composition ratios of the guide layer and the barrier layer may be different from each other.

In the foregoing embodiments, Si or Se may be employed as the dopant for the n-type first clad layer and the n-type second clad layer.

In the foregoing embodiments, Be, Mg, Zn or the like may be employed as the dopant for the p-type first upper clad layer, the p-type second upper clad layer, the p-type GaAs cap layer. Generally, the individual compound semiconductor layers are formed by using MBE (Molecular Beam Epitaxy) process for the case where Be is used as the dopant, and by using MOCVD (Metallorganic Chemical Vapor Deposition) process for the case where Mg or Zn is used as the dopant.

In the foregoing embodiments, instead of forming a dielectric film of silicon oxide, silicon nitride or the like as the buried layer, it is also possible to form a semiconductor current blocking layer such as a layer in which n-type GaAs is provided on n-type AlInP, n-type GaAs or n-type AlInP. In this case, any difference in coefficient of thermal expansion can be reduced, so that any characteristic deterioration can be made less likely to occur even through heat treatment in the process.

The window area formation technique employed in the foregoing embodiments is the so-called IILD (Impurity Induced Layer Disordering) process that Zn or other group-II atoms are diffused, where the group-II atoms accelerate the diffusion of Ga in GaAs and Al or Ga or In in AlGaInP. In this case, the diffusion source may be given by a layer containing Zn other than ZnO or a diffusion source containing Be, Mg, Cd or the like other than Zn. Also, the window area formation technique may be given by using IFVD (Impurity Free Vacancy Disordering) process that a $SiO_2$ layer or other dielectric layer is formed on a window area and vacancies of group-V atoms (As, P etc.) in heating are utilized.

Although semiconductor layers represented by the general formula of AlGaInP or GaInP are used as the lower clad layer, the active layer and the upper clad layer in the foregoing embodiments, yet it is also possible to use semiconductor layers represented by the general formula of AlGaAs or GaAs. Further, although semiconductor layers represented by the general formula of AlGaInP or GaInP are used as the lower clad layer, the active layer and the upper clad layer in the foregoing embodiments, yet it is also possible to use semiconductor layers represented by the general formula of AlGaInN or GaN. Also, although semiconductor layers represented by the general formula of AlGaInP or GaInP are used as the lower clad layer, the active layer and the upper clad layer in the foregoing embodiments, yet it is also possible to use semiconductor layers represented by the general formula of AlGaAs or InGaAs.

Furthermore, the above-described embodiments have been given only as examples, and not being limitative in every aspect. The scope of the present invention is defined not by the above description but by the appended claims, and intended to include all modifications and changes within meanings and scopes equal to those of the claims.

INDUSTRIAL APPLICABILITY

According to the semiconductor laser device of the present invention, since occurrence of ripples in the far field pattern of laser radiation light is suppressed, there can be provided a semiconductor laser device which has a horizontal radiation light distribution close to Gaussian distribution and which is superior in efficiency of use as optical disks. As a result, it becomes feasible to implement an optical-disk use pickup of simple configuration without deteriorating the use efficiency of laser light, thus contributing to reduction in size and weight and enhancement toward high-speed access of optical pickups.

The invention being thus described, it will be obvious that the invention may be varied in many ways. Such variations are not be regarded as a departure from the spirit and scope of the invention, and all such modifications as would be obvious to one skilled in the art are intended to be included within the scope of the following claims.

The invention claimed is:

1. A semiconductor laser device comprising:
   a ridge portion in which a lower clad layer, an active layer, a first upper clad layer, a second upper clad layer, and an electrode layer are stacked in order;
   first side portions which are placed on both outer sides of the ridge portion and in which the lower clad layer, the active layer, the first upper clad layer, and a buried layer having a refractive index smaller than that of the first upper clad layer are stacked in order wherein a bottom-most portion of the buried layer extends parallel to the active layer; and
   second side portions which are placed on both outer sides of the first side portions and in which the lower clad layer, the active layer, the first upper clad layer, and a light absorption layer are stacked in order, and in which the buried layer is not stacked,
   wherein a width of the first side portions is configured such that guided light does not enter the second side portions, and the light absorption layer is in electrical contact with the electrode layer.

2. The semiconductor laser device as claimed in claim 1, wherein the second side portions have an insulating layer between the first upper clad layer and the light absorption layer.

3. The semiconductor laser device as claimed in claim 1, wherein
   a distance between an upper end of the active layer and a lower end of the buried layer in the first side portions is longer than a distance between an upper end of the active layer and a lower end of the light absorption layer in the second side portions.

4. The semiconductor laser device as claimed in claim 1, wherein the light absorption layer is made from at least one of Ru, Os, Zr, Mo, W, Re, Zn, Fe, Sn, Ti, Cr, Sb, Ir, Mn, Pt and Pd.

5. The semiconductor laser device as claimed in claim 1, wherein the light absorption layer is made from any one of Ge, Si, $Si_x Ge_{1-x}$ ($0 \leq x \leq 1$), GaAs, InGaAs, AlGaAs, InP, and $(Al_x Ga_{1-x})_y In_{1-y} P$ ($0 \leq x \leq 1, 0 \leq y \leq 0.5$) and InGaAs.

6. The semiconductor laser device as claimed in claim 1, wherein a width of each of the first side portions is 1 μm to 5 μm.

7. The semiconductor laser device as claimed in claim 1, wherein the first side portions have a width of 1 μm to 5 μm in its portions except for vicinities of a light-emission end face which have a smaller width.

8. The semiconductor laser device as claimed in claim 7, wherein the first side portions have a width of substantially zero at the light-emission end face.

9. The semiconductor laser device as claimed in claim 1, wherein a thickness of the light absorption layer is 5 nm or more.

10. The semiconductor laser device as claimed in claim 2, wherein a thickness of the insulating layer is 20 nm or less.

11. The semiconductor laser device as claimed in claim 5, wherein the light absorption layer is of the opposite conductive type from a conductive type of the first upper clad layer.

12. The semiconductor laser device as claimed in claim 1, wherein the light absorption layer comprises:

a first light absorption layer made from any one of Ge, Si, $Si_x Ge_{1-x}$ (where $0 \leq x \leq 1$), GaAs, InGaAs, AlGaAs, InP, and $(Al_x Ga_{1-x})_y In_{1-y} P$ ($0 \leq x \leq 1, 0 \leq y \leq 0.5$) and InGaAs; and a second light absorption layer made from at least one of Ru, Os, Zr, Mo, W, Re, Zn, Fe, Sn, Ti, Cr, Sb, Ir, Mn, Pt and Pd.

13. The semiconductor laser device as claimed in claim 1, wherein the lower clad layer, the active layer, the first upper clad layer and the second upper clad layer are made of $(Al_x Ga_{1-x})_y In_{1-y} P$ ($0 \leq x \leq, 0 \leq y \leq 1$), respectively.

14. The semiconductor laser device as claimed in claim 1, wherein the active layer includes a quantum well, and a window area in which the active layer is intermixed is formed in a proximity to the light-emission end face.

15. A semiconductor laser device comprising:

a ridge portion in which a lower clad layer, an active layer, a first upper clad layer, a second upper clad layer, and an electrode layer are stacked in order;

first side portions, positioned at outer sides of the ridge portion, in which the lower clad layer, the active layer, the first upper clad layer, a buried layer, and the electrode layer are stacked in order wherein a bottom-most portion of the buried layer extends parallel to the active layer; and second side portions, positioned at outer sides of the first side portions, in which the lower clad layer, the active layer, the first upper clad layer, and the electrode layer are stacked in order, and in which the buried layer is not stacked, wherein, a width of the ridge portion and the first side portions is configured such that guided light does not enter the second side portions, the electrode layer in the second side portions is formed proximate to the first upper clad layer, and the light absorption layer is made from metal.

* * * * *